United States Patent [19]

Jackson et al.

[11] Patent Number: 5,006,417
[45] Date of Patent: Apr. 9, 1991

[54] TERNARY METAL MATRIX COMPOSITE

[75] Inventors: Michael B. Jackson, Greer; Peter A. Roth, Greenville, both of S.C.

[73] Assignee: Advanced Composite Materials Corporation, Greer, S.C.

[21] Appl. No.: 204,233

[22] Filed: Jun. 9, 1988

[51] Int. Cl.$^5$ .................... C22C 21/02; C22C 32/00
[52] U.S. Cl. .................... 428/614; 75/236; 75/238; 75/249
[58] Field of Search .............. 428/614; 75/249, 236, 75/238

[56] References Cited

U.S. PATENT DOCUMENTS

| | | | |
|---|---|---|---|
| 4,463,058 | 7/1984 | Hood et al. | 75/229 |
| 4,499,156 | 2/1985 | Smith et al. | 428/614 |
| 4,565,744 | 1/1986 | Walter et al. | 428/614 |
| 4,605,440 | 8/1986 | Halverson et al. | 75/238 |
| 4,682,744 | 7/1987 | Gounder | 244/133 |
| 4,696,866 | 9/1987 | Tanaka et al. | 428/614 |
| 4,699,849 | 10/1987 | Das | 428/689 |
| 4,710,348 | 12/1987 | Brupbacher et al. | 420/129 |
| 4,753,850 | 6/1988 | Ibe et al. | 428/614 |

FOREIGN PATENT DOCUMENTS

| | | |
|---|---|---|
| 188704 | 11/1985 | European Pat. Off. . |
| 213615 | 8/1986 | European Pat. Off. . |
| 223478 | 11/1986 | European Pat. Off. . |
| 2072815 | 4/1971 | France . |
| 57-98647 | 6/1982 | Japan .................... 428/614 |
| 59-162242 | 9/1984 | Japan .................... 75/249 |
| 59-173234 | 11/1984 | Japan .................... 428/614 |
| 60-50137 | 3/1985 | Japan .................... 75/249 |
| 60-50138 | 3/1985 | Japan .................... 75/249 |
| 60-245761 | 12/1985 | Japan .................... 428/614 |
| 61-35423 | 2/1986 | Japan .................... 428/614 |
| 62-174377 | 7/1987 | Japan .................... 428/614 |
| 61240979 | 4/1988 | Japan . |
| 1338088 | 12/1969 | United Kingdom . |
| 3522166 | 6/1985 | United Kingdom . |
| 2176804 | 6/1986 | United Kingdom . |

OTHER PUBLICATIONS

Divecha et al., "Mechanical Properties of Silicon Carbide Reinforced Aluminum", ICM 3, vol. 3, pp. 351-361 (1979).

Divecha et al., "Progress in the Development of SiC/Al Alloys", 12th National SAMPE Technical Conference, Oct. 7-9, 1980, pp. 656-661.

Divecha et al., "Properties of SiC Whisker Reinforced Aluminum Alloys", 24th Natl' SAMPE Symposium; Exhibition, San Francisco, May 8-10, 1979, pp. 1432-1443.

Lederich, "Deformation Behavior of Silicon-Carbide Whisker-Reinforced Aluminum Composities", Materials Science and Engineering, vol. 55, pp. 143-146, (1982).

Divecha, "Silicon Carbide Reinforced Aluminum A Formable Composite", Journal of Metal, pp. 12-17 (Sep. 1981).

Brady & Clauser, "Materials Handbook", 11th Edition, pp. 37-41.

Primary Examiner—Theodore Morris
Assistant Examiner—David Schumaker
Attorney, Agent, or Firm—Banner, Birch, McKie & Beckett

[57] ABSTRACT

A ternary metal matrix composite comprising a metallic binding matrix material and a reinforcement material consisting essentially of an insoluble ceramic and a semimetal. The ternary metal matrix composite of the invention has a coefficient of thermal expansion which is lower and more consistent than that of known binary composites using similar materials. The coefficient of thermal expansion may be tailored to meet specific application needs. The invention also has a low density, good thermal conductivity, dimensional stability, and formability. In one form of the invention, the insoluble ceramic and semi-metal contain the same element. In a preferred form of the invention, the ternary metal matrix composite comprises an aluminum alloy matrix and a reinforcement material of silicon carbide and silicon.

14 Claims, 1 Drawing Sheet

TERNARY METAL MATRIX COMPOSITE

BACKGROUND OF THE INVENTION

This invention relates to a ternary metal matrix composite comprising a metal matrix reinforced with an insoluble ceramic and a semi-metal. The ternary metal matrix composite of the present invention has a lower, more consistent coefficient of thermal expansion than binary composites using similar materials, while exhibiting low density and good formability.

Composite materials are well-known and commonly used. A composite may be defined as a man-made material in which two or more constituents are combined to create a material having properties different than those of either constituents. One form of known composite is a binary metal matrix composite, which consists of a metal matrix and a reinforcement material distributed in, and bound together by, the matrix. The reinforcement usually is in the form of fibers, whiskers or particles. Typical metal matrix binding materials include aluminum, cobalt, iron, magnesium, titanium, or alloys of these materials. Typical reinforcement materials include ceramics, such as silicon carbide, boron carbide, aluminium oxide, tungsten carbide, and other borides, carbides, oxides, nitrides, silicides, aluminides, selenides, sulfides and germanides. These binary metal matrix composites are stronger and stiffer than conventional alloys and are particularly abrasion resistant.

For the past several years extensive research has been devoted to the development of binary metal matrix composites. As a result, it is well-known that ceramic reinforcement in metal matrices improves the properties of functional characteristics or various metals and alloys. Ceramic fibers, whiskers, or particulates are used to reinforce matrix metals to enhance the specific strength, specific modulus and the temperature service capabilities of the composites. Improvement in the specific strength is achieved both by reducing the density and by increasing the absolute strength and modulus through the introduction of the ceramic reinforcement. The result is typically a composite providing significant weight reduction yet meeting critical strength or stiffness requirements. These known binary metal matrix composites, however, do not have a sufficiently low coefficient of thermal expansion and/or good thermal conductivity for many applications, particularly in the electronics industry.

These is a need for a material which has a low coefficient of thermal expansion, low density and good thermal conductivity to displace heavier materials which are currently used in electronic substrates, hermetic microcircuit packages, chip submounts, heat sinks and heat pipes. Other applications for such a material include optical substrates (e.g. mirrors) where low expansion, light weight and dimensional stability are important.

In the high-reliability-electronics industry, a metal core is often employed to constrain the epoxy-glass of circuit boards which have surface mounted ceramic components. This metal core is generally composed of copper-clad Invar, molybdenum, or copper-tungsten composites. The overall weight of these materials makes them undesirable for aeronautical and aerospace applications and other uses where light weight is critically important. The metal core of the circuit boards is required to have a low coefficient of thermal expansion to reduce the stresses on the solder joints bonding the ceramic components to the printed circuit board. Without a low coefficient of thermal expansion core, the solder joints could fall due to the differences in the expansion of the ceramic component and the epoxy-glass circuit board. The metal core of the circuit board also serves to remove heat from the circuit. Thus, for example, because Invar is a very poor thermal conductor, it must be clad with copper which increases cost and limits availability. Moreover, Invar, tungsten and molybdenum are heavy materials. Molybdenum has a density of 10.2 g/cc and Invar 8.4 g/cc. The thermal conductivity is about 150 W/mK for copper-clad Invar and 160 W/mK for molybdenum.

SUMMARY OF THE INVENTION

The present invention is a ternary metal matrix composite comprising a metallic binding matrix material and a reinforcement material consisting essentially of an insoluble ceramic and a semi-metal. Semi-metals are elements from groups IIIA through VIIA of the Periodic Table of the Elements. These elements display some of the characteristic properties of metals combined with properties of non-metals. The ternary metal matrix composite of the invention has a coefficient of thermal expansion which is lower and more consistent than that of known binary composites using similar materials. The coefficient of thermal expansion may be tailored to meet specific application needs. The invention also has a low density, good thermal conductivity, dimensional stability, and formability.

Preferably, the metal matrix of the present invention comprises 40 to 60% of the composite with a most preferred range of 45 to 55 volume percent. In the preferred form of the invention, the insoluble ceramic comprises 10–50 volume percent of the composite with a most preferred range of 30–40 volume percent. Preferably the semi-metal comprises 10–40 volume percent of the composite, with a most preferred range of 10–25 volume percent. In one form of the invention, the insoluble ceramic and semi-metal contain the same element. In a preferred form of the invention, the ternary metal matrix composite comprises an aluminum alloy matrix and a reinforcement material of silicon carbide and silicon.

DESCRIPTION OF A PREFERRED EMBODIMENT

Figure 1:
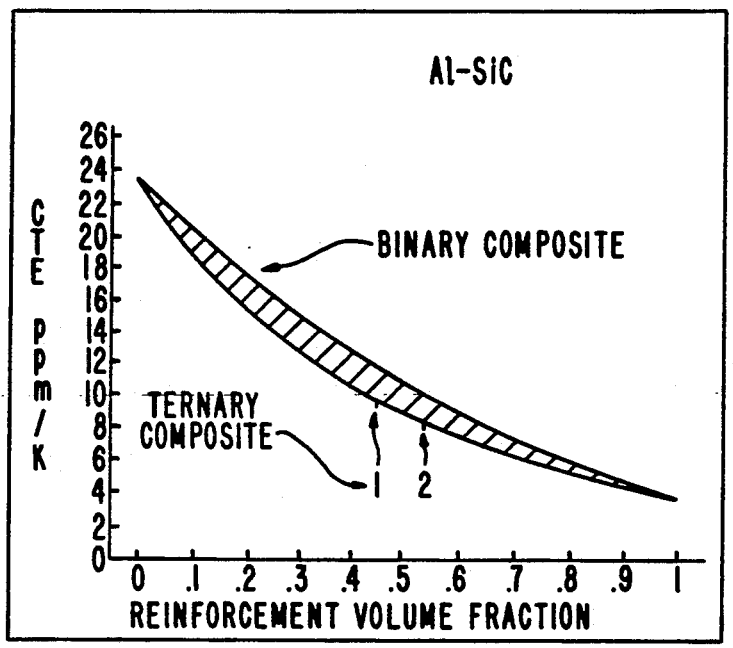
FIG. 1 is a graph comparing the coefficient of thermal expansion vs. reinforcement volume loading for two ternary metal matrix composite of the present invention and a binary composite of aluminum and silicon carbide.

The present invention is directed to a metal matrix reinforced with an insoluble ceramic and a semi-metal. The resulting ternary metal matrix composite may be tailored to match the coefficient of thermal expansion of certain ceramic materials, such as aluminum oxide, and other materials having a low coefficient of thermal expansion. The ternary composite is light weight and has a density of approximately 2.7–3.0 g/cc. Thus, it is significantly lighter in weight than other materials with a low coefficient of thermal expansion such as copper-clad-Invar, copper-tungsten, or molybdenum. The invention has a coefficient of thermal expansion range much lower than that of aluminum or aluminum alloys. The thermal conductivity of the preferred form of the invention is about 120 W/mK.

Preferably, the metal matrix of the present invention convention is aluminum or aluminum alloy. Magnesium and its alloys or titanium and its alloys may also be used for the metal matrix. Any insoluble ceramic having a low coefficient of thermal expansion and a high bulk modulus can be used in the ternary metal matrix composite of the present invention. Typical examples of a suitable insoluble ceramic are silicon carbide, silicon nitride, aluminum nitride, boron silicide, and boron carbide. The preferred semi-metals are silicon, boron, and germanium. There may be advantages in some applications for the insoluble ceramic and semi-metal to contain the same element. For example, if silicon carbide is selected as the insoluble ceramic, silicon could be selected as the semi-metal; whereas, if boron carbide is selected as the insoluble ceramic, boron could be selected as the semi-metal.

Compared to binary metal matrix composites, the ternary composition of the present invention has a lower, more consistent coefficient of thermal expansion for a given volume loading of reinforcement material. Additionally, the ternary metal matrix of the present invention has better or equal formability than is attained by reinforcing aluminum or aluminum alloys with equal amounts of either silicon or insoluble ceramic alone.

The preferred range of the ternary composition of the present invention is 40-60 volume percent metal matrix with a combination of semi-metal and insoluble ceramic making up the balance as the reinforcement material. Preferably 10-50 volume percent of the reinforcement material should be insoluble ceramic and 10-40 volume percent semi-metal. The most preferred composition and range is 45-55 volume percent aluminum or aluminum alloy matrix, with the reinforcement material being 30-40 volume percent insoluble ceramic and 10-25 volume percent semi-metal. By varying the reinforcement proportions of the insoluble ceramic and the semi-metal, the coefficient of thermal expansion can be tailored to match the needs of a particular application. The coefficient of thermal expansion near room temperature of two ternary composites in the preferred range of the present invention using an aluminum matrix and a reinforcement of silicon carbide and silicon are given n Table 1.

TABLE 1

| Material | V. % Al | V. % SiC | V. % Si | CTE (ppm/C) |
|---|---|---|---|---|
| 1 | 54.2 | 30.1 | 15.7 | 8.9 |
| 2 | 47.0 | 35.0 | 18.0 | 8.0 |

Figure 2:
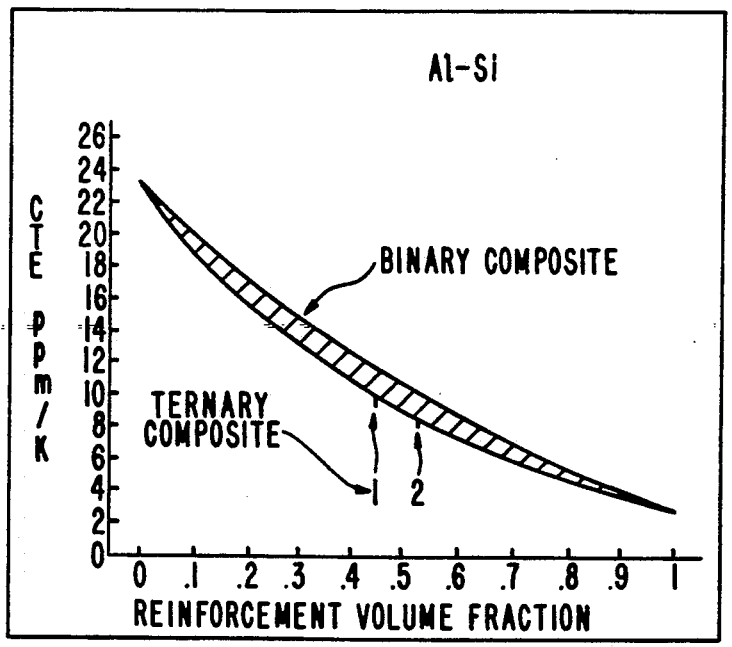
FIG. 2 is a graph comparing the coefficient of thermal expansion vs. reinforcement volume loading for two ternary metal matrix composite of the present invention and a binary composite of aluminum and silicon.

The coefficients of thermal expansion for materials 1 and 2 in Table 1 are compared in FIGS. 1 and 2 to the measure coefficient of thermal expansion for binary composites of aluminum-silicon carbide and aluminum-silicon, respectively. The range of coefficient of thermal expansion values measured for the binary composites is shown as shaded lines in these figures. The coefficient of thermal expansion of material 1 is shown as point 1 in FIGS. 1 and 2; material 2 is shown at point 2. Both FIGS. 1 and 2 show that for a given volume loading, the coefficient of thermal expansion of the ternary metal matrix composite of the present invention is measurably lower than those of the Al/SiC and Al/Si binary composites.

By employing both silicon and silicon carbide as constituents of the ternary metal matrix composite of the present invention, an advantage in gained over using either silicon or silicon carbide singularly. Aluminum with silicon and silicon carbide has a lower melting point than does aluminum with silicon carbide along. Because of this lower melting point, lower temperatures are used in the consolidation of the new material than in the consolidation of aluminum-silicon carbide. A lower consolidation temperature may allow for finer grain structures in some of the aluminum alloys. A finer grain structure improves properties such as ductility and strength. Even through the consolidation temperature is lower for the ternary metal matrix composite of the present invention, the pressure required for consolidation is not increased. Therefore, it is less difficult to manufacture material of the ternary metal matrix composite of the present invention than equally loaded aluminum or aluminum alloy with silicon carbide. Silicon (in the range of this invention) is used not only to lower the melting point but also because silicon has a lower coefficient of thermal expansion and lower density than silicon carbide and will therefore lower the coefficient of thermal expansion and density of the ternary composite. The silicon carbide reduces the embrittling influence of the silicon metal on the aluminum. Because of this the ternary composite is much less brittle with better formability and machinability than aluminum with an equivalent loading of silicon alone.

The preferred aluminum-silicon-silicon carbide ternary composite of the present invention may be made by preparing powder blends within the composition range and vacuum hot pressing the powder into full density billets. This material could also be manufactured by hot isostatic pressing, cold pressing and sintering, casting, forging, injection molding and other standard metallurgical techniques.

Although a preferred form of the invention has been described, the invention is not necessarily limited thereto. Various modifications may be made without departing from the scope of the invention, which is defined by the following claims.

We claim:

1. A ternary metal matrix composite comprising:
   a consolidated powder blend of a metallic binding matrix material comprising 40-60 vol. % of the composite; and
   a reinforcement material consisting essentially of 10-50 vol. % of an insoluble ceramic and 10-40 vol. % of a semi-metal.

2. A ternary metal matrix composite as recited in claim 1 wherein said metallic binding matrix material is selected from the group consisting of aluminum and its alloys, magnesium and its alloys, and titanium and its alloys.

3. A ternary metal matrix composite as recited in claim 1 wherein said insoluble ceramic is selected from the group consisting of silicon carbide, silicon nitride, aluminum nitride, boron silicide and boron carbide.

4. A ternary metal matrix composite as recited in claim 1 wherein said semi-metal is selected from the group consisting of silicon, boron, and germanium.

5. A ternary metal matrix composite as recited in claim 1 wherein said insoluble ceramic and said semi-metal contain the same element.

6. A ternary metal matrix composite as recited in claim 5 wherein said element is silicon.

7. A ternary metal matrix composite as recited in claim 5 wherein said element is boron.

8. A ternary metal matrix composite as recited in claim 5 wherein said metallic binding matrix material comprises 45-55 volume percent of the composite, said insoluble ceramic comprises 30-40 volume percent of the composite, and said semi-metal comprises 10-25 volume percent of the composite.

9. A ternary metal matrix composite comprising an aluminum or aluminum alloy matrix which comprises 40-60 volume percent of the composite and a reinforcing material consisting essentially of 10-50 volume percent silicon carbide and 10-40 volume percent silicon.

10. A ternary metal matrix composite as recited in claim 9 wherein said aluminum or aluminum alloy matrix comprises 45-55 volume percent of the composite, said silicon carbide comprises 30-40 volume percent of the composite, and said silicon comprises 10-25 volume percent of the composite.

11. A ternary metal matrix composite comprising:
a metallic binding matrix material comprising 40-60 vol. % of the composite, and
a reinforcement material consisting essentially of 10-50 vol. % of an insoluble ceramic and 10-40 vol. % of a semi-metal of the same element as said insoluble ceramic.

12. A ternary metal matrix composite according to claim 11 wherein the metallic binding matrix material comprises 45-55 vol. %, the insoluble ceramic comprises 30-40 vol. %, and the semi-metal comprises 10-25 vol. %.

13. A ternary metal matrix composite according to claim 11 wherein said metallic binding matrix material comprises aluminum or an aluminum alloy, said insoluble ceramic comprises insoluble ceramic is silicon carbide, and the semi-metal is silicon.

14. A ternary metal matrix composite according to claim 13 wherein the aluminum or aluminum alloy comprises 45-55 vol. %, the silicon carbide comprises 30-40 vol. %, and the silicon comprises 10-25 vol. %.

* * * * *